United States Patent
Naik et al.

(10) Patent No.: US 8,812,569 B2
(45) Date of Patent: Aug. 19, 2014

(54) DIGITAL FILTER IMPLEMENTATION FOR EXPLOITING STATISTICAL PROPERTIES OF SIGNAL AND COEFFICIENTS

(75) Inventors: Parag Naik, Karnataka (IN); Anindya Saha, Karnataka (IN); Gururaj Padaki, Karnataka (IN); Subrahmanya Kondageri Shankaraiah, Karnataka (IN); Saurabh Mishra, Karnataka (IN)

(73) Assignee: Saankhya Labs Private Limited, Bangalore (IN)

( * ) Notice: Subject to any disclaimer, the term of this patent is extended or adjusted under 35 U.S.C. 154(b) by 358 days.

(21) Appl. No.: 13/462,116

(22) Filed: May 2, 2012

(65) Prior Publication Data

US 2012/0284318 A1    Nov. 8, 2012

(30) Foreign Application Priority Data

May 2, 2011 (IN) ............................ 1512/CHE/2011

(51) Int. Cl.
  *G06F 17/10* (2006.01)
  *G06F 7/38* (2006.01)
(52) U.S. Cl.
  USPC .......................................... 708/230; 708/518
(58) Field of Classification Search
  CPC .................. H03H 17/0248; H03H 17/0255
  USPC ................................................ 708/300, 518
  See application file for complete search history.

(56) References Cited

U.S. PATENT DOCUMENTS

| 5,923,273 | A | 7/1999 | Pastorello |
| 6,600,788 | B1 * | 7/2003 | Dick et al. ................. 375/245 |
| 6,816,473 | B2 * | 11/2004 | Ozluturk et al. ............ 370/335 |
| 6,876,698 | B1 * | 4/2005 | Dick et al. ................. 375/229 |
| 7,493,354 | B2 | 2/2009 | Hatamian |
| 2003/0154347 | A1 | 8/2003 | Ma et al. |

* cited by examiner

*Primary Examiner* — Chuong D Ngo
(74) *Attorney, Agent, or Firm* — The Law Office of Austin Bonderer, PC; Austin Bonderer

(57) ABSTRACT

A method for implementing a digital filter is provided. The method includes (a) determining a bit-width of an incoming data sample of an incoming signal by measuring a distance between a leading zero or one of the incoming data sample and a trailing zero of the incoming data sample. The incoming data sample is obtained by sampling the incoming signal at a pre-defined time interval, (b) obtaining bit-width multipliers with variable bit-widths based on a first probability distribution function (PDF) of bit-widths of incoming data samples, (c) allocating the incoming data sample and a filter coefficient based on the bit-width of the incoming data sample and a bit-width of the filter coefficient to one bit-width multiplier of the bit-width multipliers, and (d) performing a multiply operation of a Multiply and Accumulate (MAC) operation on the one bit-width multiplier to generate an output of the digital filter.

15 Claims, 14 Drawing Sheets

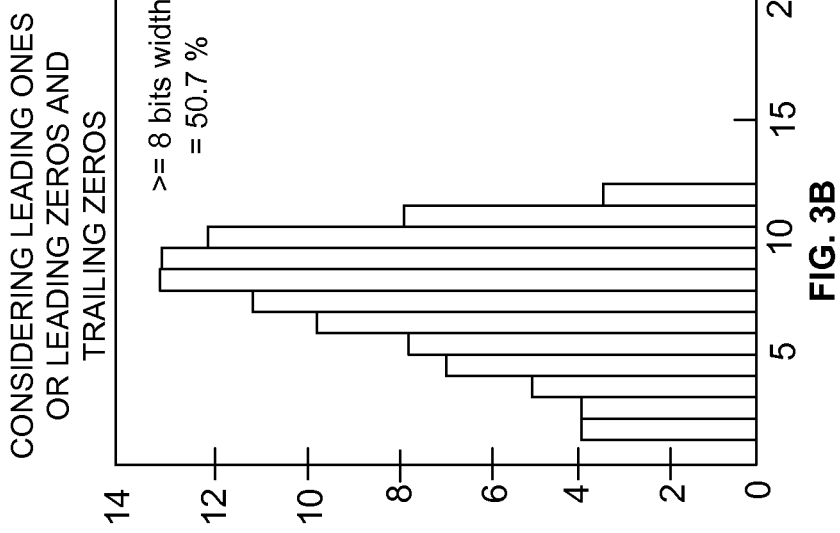
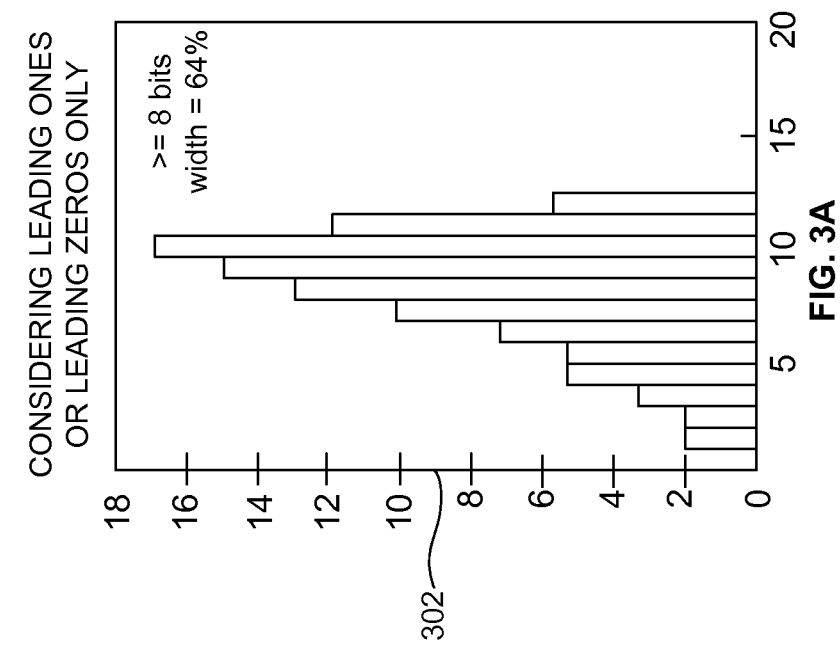

DIGITAL FILTER IMPLEMENTATION FOR EXPLOITING STATISTICAL PROPERTIES OF SIGNAL AND COEFFICIENTS

BACKGROUND

1. Technical Field

The embodiments herein generally relate to a filter and, more particularly, to an implementation of a digital filter and an adaptive digital filter by exploiting statistical properties of an incoming signal and filter coefficients.

2. Description of the Related Art

In modern communication systems, there are instances in which an incoming signal to a system contains additional noise which can degrade the quality of the desired signal. In such cases, a filter is used to remove additional noise thus preventing the incoming signal from further degradation. A Finite Impulse Response (FIR) filter is one of the primary types of filters used in Digital Signal Processing. The finite impulse response (FIR) filter is a signal processing filter with an impulse response (e.g., a response to any finite length input) of a finite duration, since it settles to zero within a finite time. This is in contrast to an infinite impulse response (IIR) filter, which has internal feedback and that may continue to respond indefinitely (e.g., decaying). The impulse response of an Nth-order discrete-time FIR filter (e.g., with a Kronecker delta impulse input) lasts for N samples and then dies to zero. Typically digital filters (e.g., normal FIR filters and IIR filters) are designed in a high level language like Matlab or by using filter design packages. The main parameters for determining merit of a design of a digital filter are performance of the digital filter in terms of a SNR metric, and efficiency of implementation of the digital filter in terms of area and power.

Given a particular SNR requirement, filter designers optimize the implementation by trading off one or more parameters such as i) sampling rate of an incoming signal, ii) bit widths of the incoming signal, iii) bit widths of filter coefficients of a filter and iv) choice of the filter structure. In the case of non-adaptive filters, filter coefficients are a set of constants used to multiply against delayed sample values, while in case of adaptive filters the filter coefficients are adaptively changed based on an adaptive algorithm. The above mentioned parameters ii) and iii) impact the bit width of a multiply and accumulate (MAC) unit, which is a fundamental building block for most filters. Further, the MAC unit performs a multiply and accumulate operation by multiplying a filter coefficient by a corresponding delayed data sample and accumulating the result. Bit widths of the MAC unit directly impact area and power of the filter.

A filter may be implemented as a software kernel for execution on a Digital Signal Processor (DSP) or as a hardwired custom hardware in digital logic. Bit widths of an incoming signal are decided based on the above implementation type. For a custom hardwired filter, an ADC precision or an implementation margin provided by a system designer to a block decides the bit width of the incoming signal. Whereas, filter coefficients bit widths are decided by a performance requirement of the filter. However in software implementations the bit width of the incoming data sample is quantized to a set of predefined bit widths defined by the DSP or CPU architectures. Typically, the bit widths are a set of 8/16/32/64.

A filter has many taps or coefficients as shown in accordance with the equation:

$$y(n) = \sum_{k=0}^{N-1} w[k] \cdot x[n-k]$$

The above implementations (both hardwired and software) assume that each incoming data sample and filter coefficient need the worst case precision. These implementations are inefficient in terms of both area and power as not all the incoming data samples and the coefficients need the worst case bit-width.

Existing implementations of optimized FIR filters with reduced gate counts involve i) choosing from a variety of existing filter structures to vary an order of operations and reduced precision (e.g., a transpose form, DF1 and DF2), and ii) using strength reduction techniques to convert multipliers to shifters (typically used in the filter coefficient design). This first technique gives limited area reduction whereas the second technique results in performance loss. Another optimization technique involves a successive approximation method of computing a given filtered value through multiple iterations. This method takes too long and is not suitable for software implementations of filters and high speed hardware implementations.

Further, an adaptive filter is useful whenever statistics of incoming signals to a filter are unknown or time varying. Hence, the design requirements for an adaptive filter cannot be specified easily. Examples of such applications include system identification, channel equalization, channel identification and interference suppression in communications systems. Typically the adaptive filter measures an output signal of the filter, and compares it to a desired output signal dictated by a true system. By observing an error between the output signal of the filter and the desired output signal, an adaptation algorithm updates filter coefficients with an aim to minimize an objective function.

FIG. 1 shows a schematic diagram of a typical adaptive filter 102, where x(k), y(k), d(k), and e(k) are the input, output, desired output and error signals of the adaptive filter 102 for a time instant k. As can be seen from FIG. 1, the adaptive filter 102 is a nonlinear filter through its dependence on the incoming signals, although, at a given time instant it can act as a linear filter. The filter coefficients w(k) are dependent on a correction factor to the coefficients (ΔW(k)) generated by an adaptive algorithm 104. Most of adaptive filters are digital filters and a large number of taps results in large area and power consumption. Accordingly, there is a need for an efficient implementation of a digital filter without reducing system performance.

SUMMARY

In view of foregoing embodiments herein is provided a method for implementing a digital filter provided. The method includes (a) determining a bit-width of an incoming data sample of an incoming signal by measuring a distance between a leading zero or one of the incoming data sample and a trailing zero of the incoming data sample, (b) obtaining bit-width multipliers with variable bit-widths based on a first probability distribution function (PDF) for bit-widths of incoming data samples, and (c) allocating the incoming data sample and a filter coefficient based on the bit-width of the incoming data sample and a bit-width of the filter coefficient to one bit-width multiplier of the bit-width multipliers, and (d) performing a multiply operation of a Multiply and Accumulate (MAC) operation on the one bit-width multiplier to generate an output of the digital filter. The incoming data sample is obtained by sampling the incoming signal at a pre-defined time interval.

A second probability distribution function (PDF) may be computed for bit-widths of filter coefficients. The bit-width multipliers with variable bit-widths based on a combination of (i) the first PDF for the bit-widths of incoming data samples and (ii) the second PDF for bit-widths of filter coefficients. The first PDF for the bit-widths of incoming data samples may be computed dynamically by measuring distances between leading zeros or ones and trailing zeros for each of the incoming data samples.

The incoming data sample and the filter coefficient may be allocated to the one bit-width multiplier by (e) determining a maximum out of the bit-width of the incoming data sample and the bit-width of the filter coefficient, (f) determining a subset of bit-width multipliers from the bit-width multipliers having a bit-width greater than the maximum out of the bit-width of the incoming data sample and the bit-width of the filter coefficient, and (g) determining a least bit-width multiplier out of the subset of bit-width multipliers.

Incoming data samples may be sorted in an order of low precision to high precision to obtain sorted incoming data samples. The incoming data sample is allocated to the bit-width multiplier based on the sorted incoming data samples. Incoming data samples of the incoming signal and filter coefficients of the digital filter are sorted to obtain sorted incoming data samples and sorted filter coefficients. The incoming data sample and the filter coefficient are allocated to the bit-width multiplier based on the sorted incoming data samples and the sorted filter coefficients.

The incoming data samples and the filter coefficients may be sorted by a load store unit simultaneously while performing (i) loading of the incoming data samples and the filter coefficients, and (ii) storing of the incoming data samples and the filter coefficients. The incoming data samples and the filter coefficients may be sorted by a Multiply and Accumulate (MAC) unit simultaneously while performing a multiply and accumulate operation. The incoming data samples and the filter coefficients are sorted based on bit-width by an arithmetic unit simultaneously while performing an arithmetic calculation.

In another aspect, a system for implementing a digital filter includes memory that stores incoming data samples, a processor that executes a set of instructions, the processor including at least one of: (i) a load store unit, (ii) a Multiply and accumulate (MAC) unit, (iii) an arithmetic unit. The set of instructions include instructions for (a) determining a bit-width of an incoming data sample of an incoming signal by measuring a distance between a leading zero or one of the incoming data sample and a trailing zero of the incoming data sample, (b) obtaining bit-width multipliers with variable bit-widths based on a first probability distribution function (PDF) for bit-widths of incoming data samples, and (c) allocating the incoming data sample and filter coefficient based on a bit-width of the incoming data sample and a bit-width of the filter coefficient to one bit-width multiplier from the bit-width multipliers, and performing a multiply operation of a Multiply and Accumulate (MAC) operation on the one bit-width multiplier to generate an output of the digital filter. The incoming data sample is obtained by sampling the incoming signal at a pre-defined time interval A second probability distribution function (PDF) may be computed for bit-widths of filter coefficients. The bit-width multipliers with variable bit-widths may be obtained based on a combination of (i) the first PDF for the bit-widths of incoming data samples and (ii) the second PDF for the bit-widths of filter coefficients.

Instructions for allocating the incoming data sample and the filter coefficient to the bit-width multiplier may include instructions for (e) determining a maximum out of the bit-width of the incoming data sample and the bit-width of the filter coefficient, (f) determining a subset of bit-width multipliers from the bit-width multipliers having a bit-width greater than the maximum out of the bit-width of the incoming data sample and the bit-width of the filter coefficient, and (g) determining a least bit-width multiplier out of the subset of bit-width multipliers. Clocks or power for the bit-width multipliers other than the least bit-width multiplier out of the subset of bit-width multipliers may be gated off while allocating the incoming data sample and the filter coefficient to the least bit-width multiplier.

The foregoing description of the specific embodiments will so fully reveal the general nature of the embodiments herein that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments herein have been described in terms of preferred embodiments, those skilled in the art will recognize that the embodiments herein can be practiced with modification within the spirit and scope of the appended claims.

BRIEF DESCRIPTION OF THE DRAWINGS

These and other features, aspects, and advantages of the present embodiment will become better understood with regard to the following description, appended claims, and accompanying drawings, in which:

FIG. 3A and FIG. 3B illustrate a graphical representation of a first probability distribution function (PDF) of bit-widths of incoming data samples of FIG. 2 computed for a size of 12-bit data statically for a block size 16 according to an embodiment herein;

DETAILED DESCRIPTION OF PREFERRED EMBODIMENTS

Figure 1:
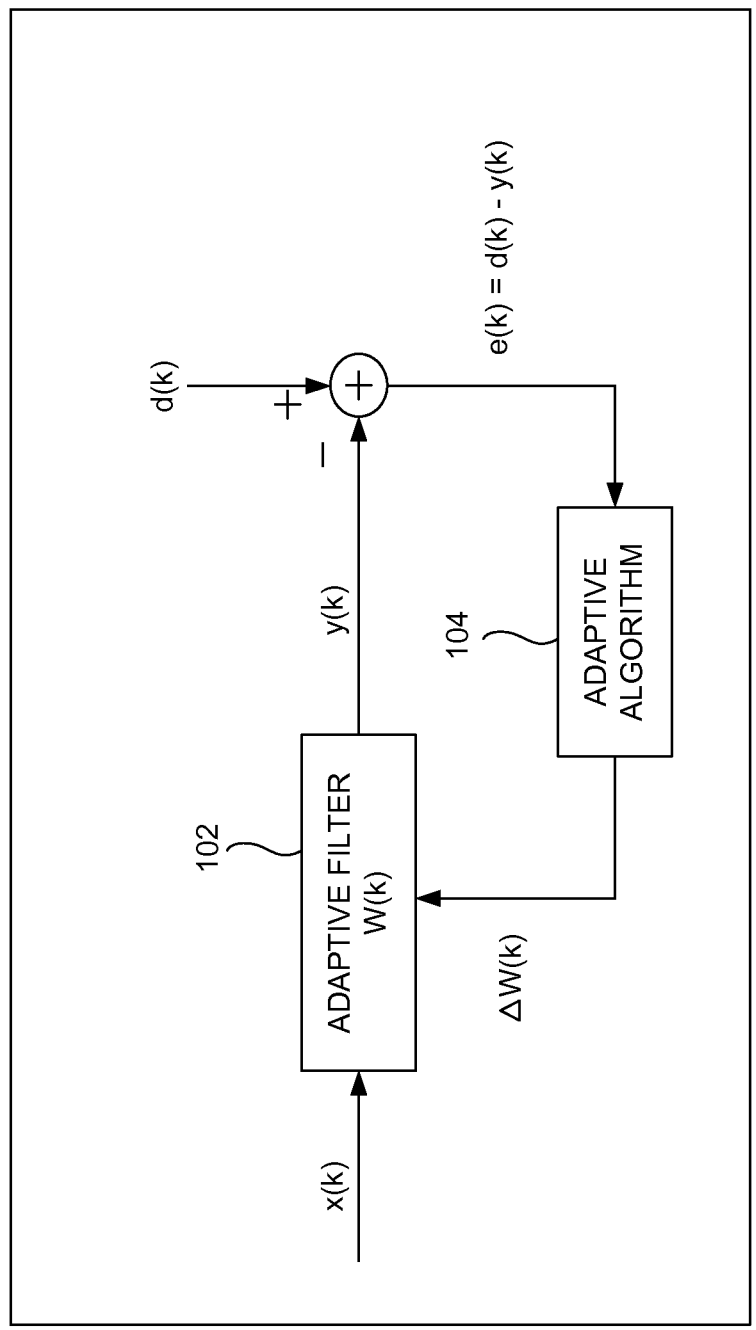
FIG. 1 shows a schematic diagram of a typical adaptive filter.

The embodiments herein and the various features and advantageous details thereof are explained more fully with reference to the non-limiting embodiments that are illustrated in the accompanying drawings and detailed in the following description. Descriptions of well-known components and processing techniques are omitted so as to not unnecessarily obscure the embodiments herein. The examples used herein are intended merely to facilitate an understanding of ways in which the embodiments herein may be practiced and to further enable those of skill in the art to practice the embodiments herein. Accordingly, the examples should not be construed as limiting the scope of the embodiments herein.

Accordingly, there remains for a need for implementing a digital filter by exploiting statistical properties of an incoming signal and filter coefficients of the digital filter without reducing the system performance. The embodiments herein achieve this by exploiting the statistical properties of the incoming signal to obtain a probability distribution function (PDF) for bit-widths of incoming data samples of the incoming signal that need to be filtered. The incoming data samples may be the output of an Analog to Digital Converter (ADC). Further, the incoming data samples may be obtained from a video corrupted with Additive White Gaussian Noise (AWGN), an audio corrupted with AWGN noise, and a digitally modulated data corrupted by multi-path and AWGN noise.

A probability distribution function (PDF) of amplitudes of the bit-widths of incoming data samples and bit-widths of filter coefficients corrupted by the AWGN may be a classic Gaussian distribution (Normal distribution). Referring now to the FIG. 2 through FIG. 10, where similar reference characters denote corresponding features consistently throughout the figures, there are shown preferred embodiments.

Figure 2:
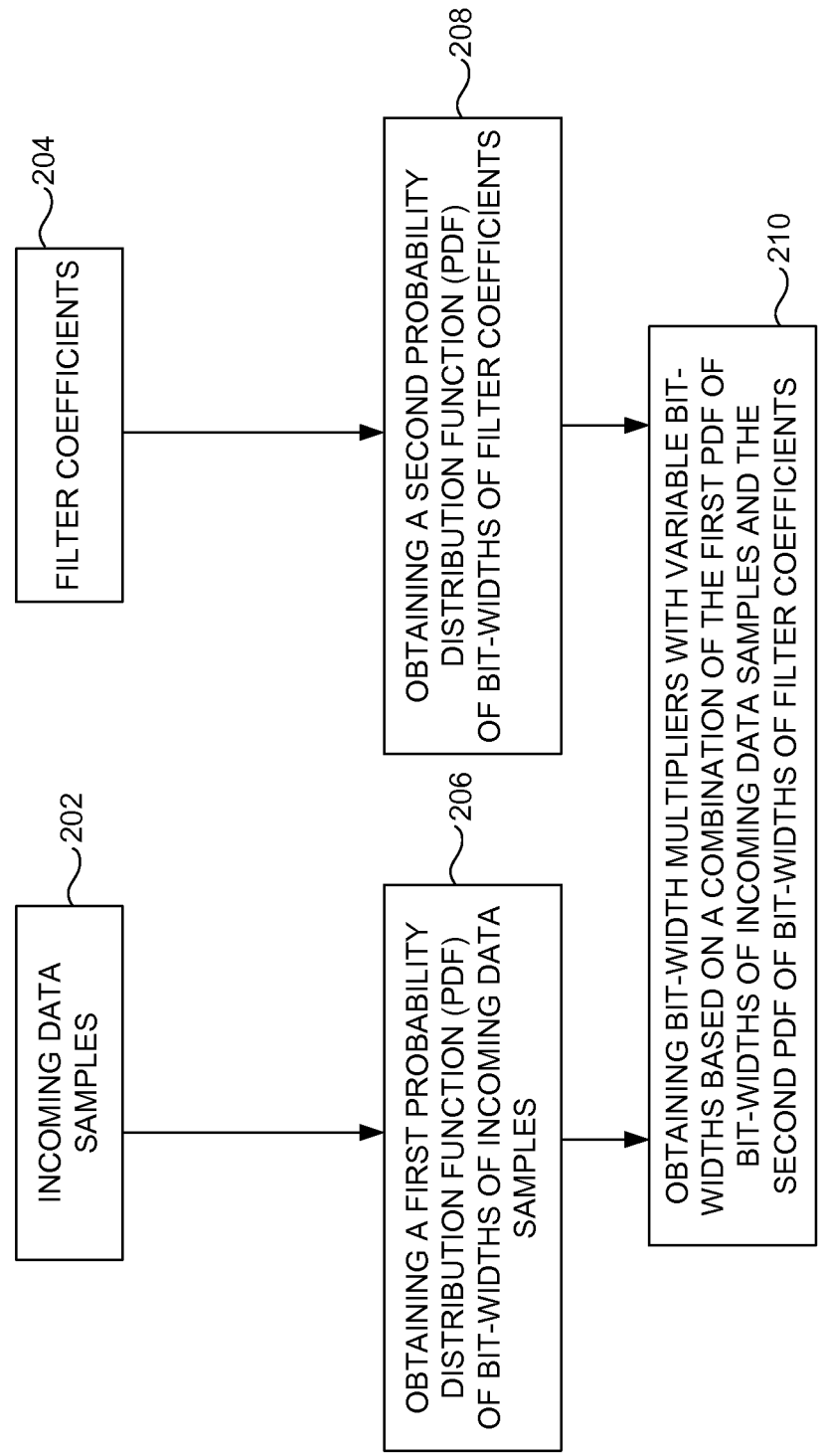
FIG. 2 illustrates a flow chart for obtaining bit-width multipliers with variable bit-widths for incoming data samples and filter coefficients of a digital filter according to an embodiment herein.

FIG. 2 illustrates a flow chart for obtaining bit-width multipliers with variable bit-widths for incoming data samples and filter coefficients of a digital filter according to an embodiment herein. In one embodiment, the digital filter is a Finite impulse response (FIR) filter. In another embodiment, the digital filter is an Infinite impulse response (IIR) filter. Each incoming data sample is obtained from incoming data samples 202 by sampling an incoming signal at a pre-defined time interval. A bit-width of incoming data sample may be determined by measuring a distance between a leading zero or one and a trailing zero of the incoming data sample. In step 206, first probability distribution function (PDF) of incoming data samples is obtained by measuring bit-widths for each of the incoming data sample of the incoming signal.

Further, for the digital filter, filter coefficients 204 are pre-defined. In step 208, a second probability distribution function for bit-widths of filter coefficients is computed similarly from each pre-defined bit-width of the filter coefficients 204 of the digital filter. In step 210, the bit-width multipliers with variable bit-widths based on a combination of the first PDF of bit-widths of incoming data samples and the second PDF of bit-widths of filter coefficients. In one embodiment, selecting the bit-width multipliers is based on a percentile rank of the first PDF of bit-widths of incoming data samples or the second PDF of bit-widths of filter coefficients. For example, when a bit-width is chosen, and the percentile rank for the bit-width is 25, then 25% of the incoming data samples 202 are found to be below the chosen bit-width in the incoming signal or 25% of filter coefficients 204 are found to be below the chosen bit-width of the filter coefficients 204 for the digital filter. Similarly, when a bit-width is chosen for which the percentile rank is 50, 50% of the incoming data samples 202 are found to be below the chosen bit-width in the incoming signal or 50% of filter coefficients 204 are found to be below the chosen bit-width of the filter coefficient 204 for the digital filter. Similarly one can choose a bit-width for which percentile rank is 75% also.

For instance, when a filter whose incoming data samples have a PDF such that for the percentile rank of 25 the chosen bit width is 4, then 25% of the bit-width multipliers of bit-width 4×4 are selected. Similarly if for the percentile rank of 50 the chosen bit-width is 8, then 25% of the bit-width multipliers of bit-width 8×8 are selected. Alternatively, selecting the bit-width multiplier may be based on a different percentile statistics.

In another embodiment, the bit-width multipliers with variable bit-widths are selected based on computing a joint PDF for the first PDF and the second PDF. Since, the bit-width multipliers are selectively utilized, usage of the bit-width multipliers is reduced effectively by 50%. These results in the digital filter with reduce area size, power consumption and device cost.

FIG. 3A and FIG. 3B illustrate a graphical representation of the first probability distribution function (PDF) of bit-widths of incoming data samples computed for a size of 12-bit data statically for a block size 16 according to an embodiment herein. Generally, the digital filter, for example FIR filters are implemented on a block of data in accordance with the equation: x $$y(n) = \sum_{k=0}^{N-1} w[k] \cdot x[n-k]$$

From a simulation data it can be concluded that only 50% of an incoming data needs full precision multipliers. The difference between PDF's of the FIG. 3A and the FIG. 3B lies in a way a precision bit-width is calculated. In the graphical representation 302, only amplitudes of the 12-bit data are used for computing the first PDF. However, in the graphical representation 304, the first PDF is obtained by measuring an effective distance between leading zeros or ones and trailing zeros of each incoming data sample of the incoming data samples 202 of the incoming signal. This complicates the multiplication operation but reduces an assumption of effective worst case precision.

Figure 4:
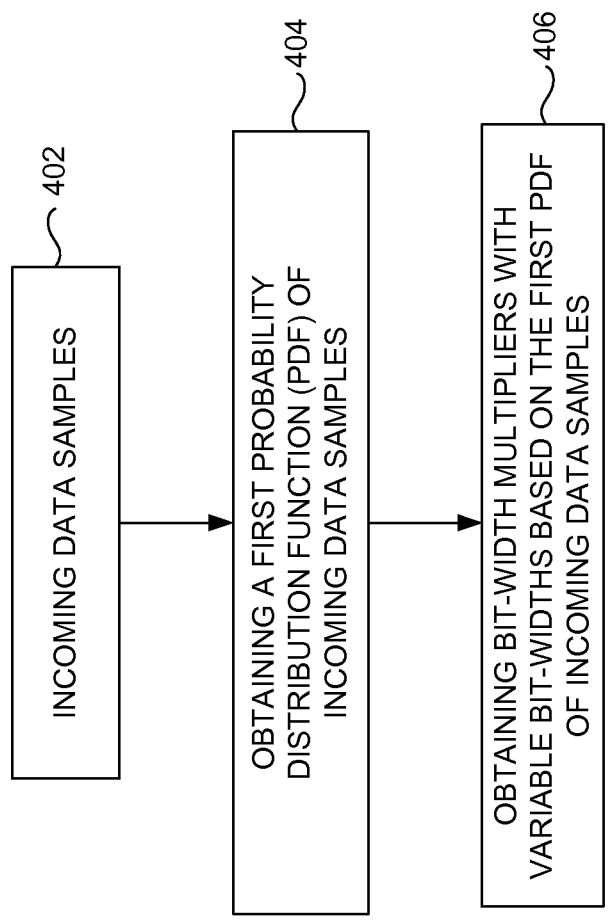
FIG. 4 illustrates a flow chart for obtaining bit-width multipliers with variable bit-widths for incoming data samples of an adaptive digital filter according to an embodiment herein.

In another embodiment, the first PDF of bit-widths of incoming data samples are computed dynamically by measuring a distance between the leading zeros or ones and the trailing zeros of the incoming data samples 202 using a pseudo code as shown below Q=16; % computing PDF over bit width of 0 to 15
Bit width Pdf=zeros(1,Q); % vector containing count of sample of bit-width from 0 to Q−1
For cnt=1 to length(Data) % Data::input data vector
Temp1=abs(Data(cnt)); % get the absolute value of the input sample
Temp2=MSB(temp1) % get the number of leading zeros or ones in the data
Bit width Pdf (Temp2+1)=bit width Pdf (Temp2+1)+1; % increment the count end FIG. 4 illustrates a flow chart for obtaining bit-width multipliers with variable bit-widths for incoming data samples of an adaptive digital filter according to an embodiment herein. For an adaptive filter, the filter coefficients change dynamically based on an adaptive algorithm. In step 404, first probability distribution function (PDF) of incoming data samples is obtained. The first PDF may be computed, or obtained from a previous computation. In step 406, bit-width multipliers with variable bit-widths are obtained based on the first PDF of incoming data samples.

Figure 5A:
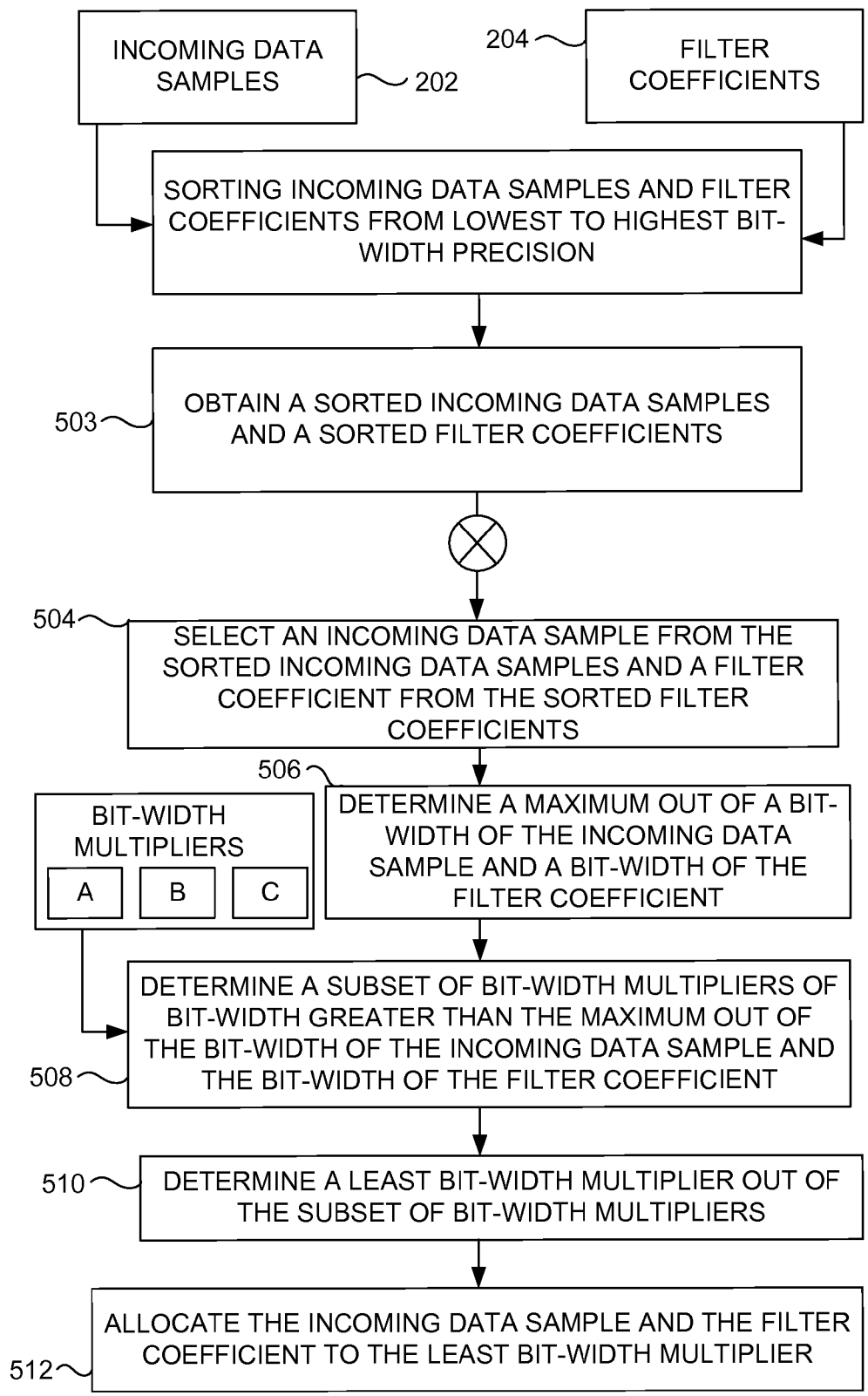
FIG. 5A illustrates a flow chart for allocating incoming data samples and filter coefficients to bit-width multipliers of a digital filter according to an embodiment herein.

FIG. 5A illustrates a flow chart for allocating the incoming data samples 202 and the filter coefficients 204 of FIG. 2 to bit-width multipliers of a digital filter according to an embodiment herein. The bit-width multipliers include varying bit-width multipliers (For example, 4×4 multiplier, 8×8 multiplier, 16×16 multiplier). In step 502, the incoming data samples 202 and the filter coefficients 204 are sorted using a pseudo C code (a pseudo code for sorting), an example of which is provided at the end of description. In step 503, sorted incoming data samples and sorted filter coefficients are obtained from sorting the incoming data samples 202 and the filter coefficients 204. In one embodiment, the sorting may be done in an order of a low bit-width precision to a high bit-width precision for reducing complexity of a sorting function. However, the sorting function may also be done in any order of bit-width precision.

In step 504, an incoming data sample is selected from the sorted incoming data samples and a corresponding filter coefficient is selected from the sorted filter coefficients. In step 506, a maximum out of the bit-width of the incoming data sample and the bit-width of the filter coefficient is determined. In step 508, from bit-width multipliers (represented as A, B, and C), a subset of bit-width multipliers out of variable bit-widths greater than the maximum out of a bit-width of the incoming data sample and a bit-width of the filter coefficient is determined. In step 510, a least bit-width multiplier is determined out of the subset of bit width multipliers. In step 512, the incoming data sample and the filter coefficient are allocated to the least bit-width multiplier.

For example, the bit-width of the incoming data sample is 3 bit-data, and the bit-width of the filter coefficient is 7 bit-data. From step 506, the maximum out of the bit-width of the incoming data sample and the bit-width of the filter coefficient is determined as bit-width of the filter coefficient (i.e. 7 bit). From step 508, a subset of bit-width multipliers of variable bit-widths greater than the bit-width of the filter coefficient of size 7 bit-data is the 8×8 multiplier, and the 16×16 multiplier. From step 510, a least bit-width multiplier out of the bit-width multipliers of variable bit-widths greater than the bit-width of the filter coefficient is 8×8 multiplier. In step 512, the incoming data sample of size 3 bit-data and the filter coefficient of size 7 bit-data are allocated to the least bit-width multiplier of size 8×8.

In one embodiment, clocks or power for bit-width multipliers other than the least bit-width multiplier are gated off while allocating the bit-width of the incoming data sample and the bit-Width of the filter coefficient to the least bit-width multiplier. Clock gating or power gating of digital circuits is used to reduce power dissipation. When the bit-width multipliers other than the least bit-width multiplier are operated such that a clock is not toggling and there is a reduction in dynamic power dissipation. Additional leakage power savings can be obtained by gating the power to the bit-width multipliers other than the least bit-width multiplier. The combination of two reduces both dynamic and a leakage power.

Figure 5B:
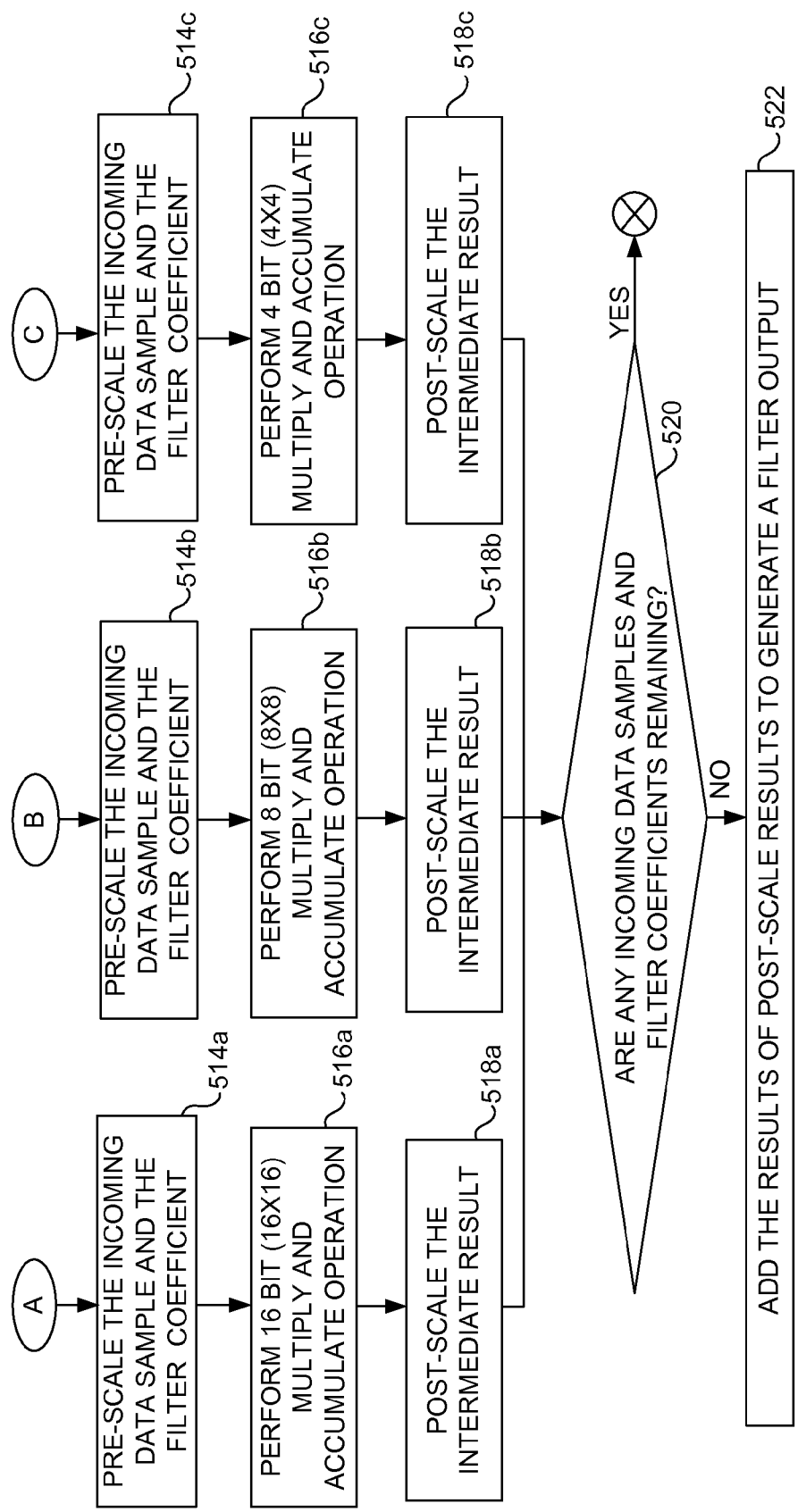
FIG. 5B illustrates a flow chart for generating a filter output for the digital filter according to an embodiment herein.

FIG. 5B illustrates a flow chart for generating a filter output for the digital filter according to an embodiment herein. In step 514a, pre-scaling of an incoming data sample and a filter coefficient that are allocated to a least bit-width multiplier (for example, A) is performed to obtain a pre-scaled incoming data sample and a pre-scaled filter coefficient. Similarly, in step 514b and 514c, pre-scaling is performed on an incoming data sample and a filter coefficient that are allocated to a least bit-width multiplier (for example, B and C) respectively. In step 516a-c, a multiply and accumulate operation is performed on the pre-scaled incoming data sample and the pre-scaled filter coefficient in the least bit-width multipliers (For example A, B and C) respectively. In step 518a-c, a post-scaling is performed on an output of the multiply and accumulate operation to obtain post-scaling results. In step 520, it is determined whether there are any sorted incoming data samples and sorted filter coefficients remaining that are not yet allocated to corresponding bit-width multipliers. When any sorted incoming data samples and sorted filter coefficient remain, the steps 504-518 are repeated until all the sorted incoming data samples and the sorted filter coefficients are allocated. When all the sorted incoming data samples and the sorted filter coefficients are allocated, in step 522, each of post-scaling results obtained from the step 518a-c are added to obtain a filter output.

Figure 6A:
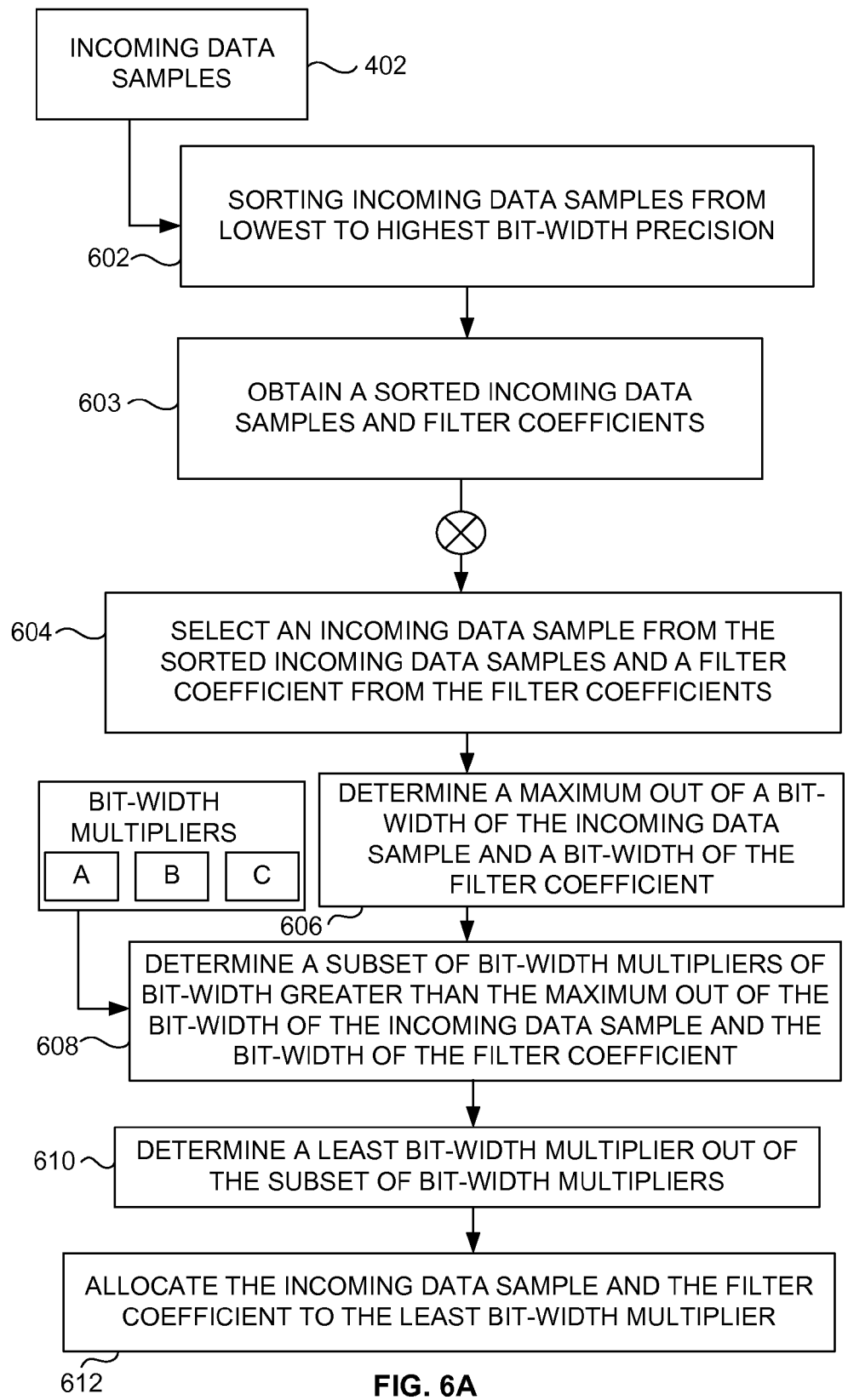
FIG. 6A illustrates a flow chart for allocating incoming data samples and filter coefficients to bit-width multipliers of an adaptive digital filter according to an embodiment herein.

FIG. 6A illustrates a flow chart for allocating the incoming data samples 402 of FIG. 4 and filter coefficients to bit-width multipliers of an adaptive digital filter according to an embodiment herein. In step 602, the incoming data samples 402 are sorted using a pseudo C code. In step 603, a sorted incoming data samples is obtained from sorting of the incoming data samples 402. In one embodiment, the sorting may be done in an order of low bit-width precision to high bit-width precision for reducing complexity of a sorting function. However, the sorting may also be done in any order of bit-width precision.

In step 604, an incoming data sample is selected from the sorted incoming data samples and a corresponding filter coefficient is selected from filter coefficients. In step 606, a maximum out of a bit-width of the incoming data sample and a bit-width of the filter coefficient is determined. In step 608, from the bit-width multipliers (represented as A, B, and C), a subset of bit-width multipliers of variable bit-widths greater than the maximum out of the bit-width of the incoming data sample and the bit-width of the filter coefficient is determined. In step 610, a least bit-width multiplier is determined out of the subset of bit-width multipliers. In step 612, the incoming data sample and the filter coefficient are allocated to the least bit-width multiplier.

Figure 6B:
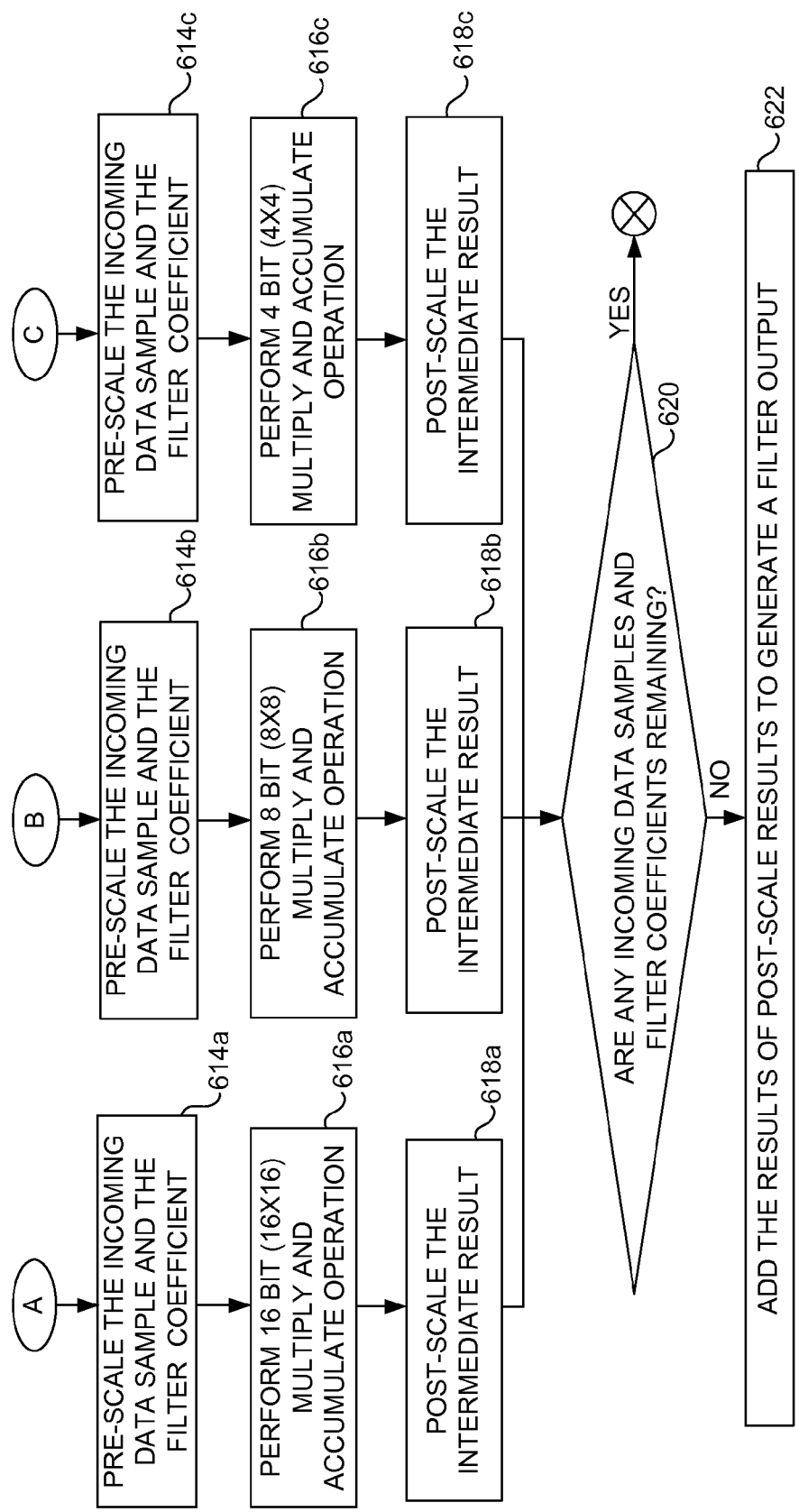
FIG. 6B illustrates a flow chart for generating a filter output for the adaptive digital filter according to an embodiment herein.

FIG. 6B illustrates a flow chart for generating a filter output for the adaptive digital filter according to an embodiment herein. In step 614 a, pre-scaling of an incoming data sample and a filter coefficient that are allocated to a least bit-width multiplier (for example, A) is performed to obtain a pre-scaled incoming data sample and a pre-scaled filter coefficient. Similarly, in step 614b and 614c, pre-scaling is performed on an incoming data sample and a filter coefficient that are allocated to a least bit-width multiplier (For example, B and C) respectively. In step 616a-c, a multiply and accumulate operation is performed on the pre-scaled incoming data sample and the pre-scaled filter coefficient in the least bit-width multipliers (A, B and C) respectively. In step 618a-c, a post-scaling is performed on an output of the multiply and accumulate operation to obtain post-scaling results. In step 620, it is determined whether there are any incoming data samples and filter coefficients remaining that are not yet is allocated to corresponding bit-width multipliers. When any sorted incoming data samples and filter coefficients are remaining, the steps 604-618 are repeated. This is continued until all the sorted incoming data samples and the filter coefficients are allocated. When all the sorted incoming data samples and the filter coefficients are already allocated, in step 622, each of post-scaling results obtained from the step 618a-c are added to obtain a filter output.

Figure 7:
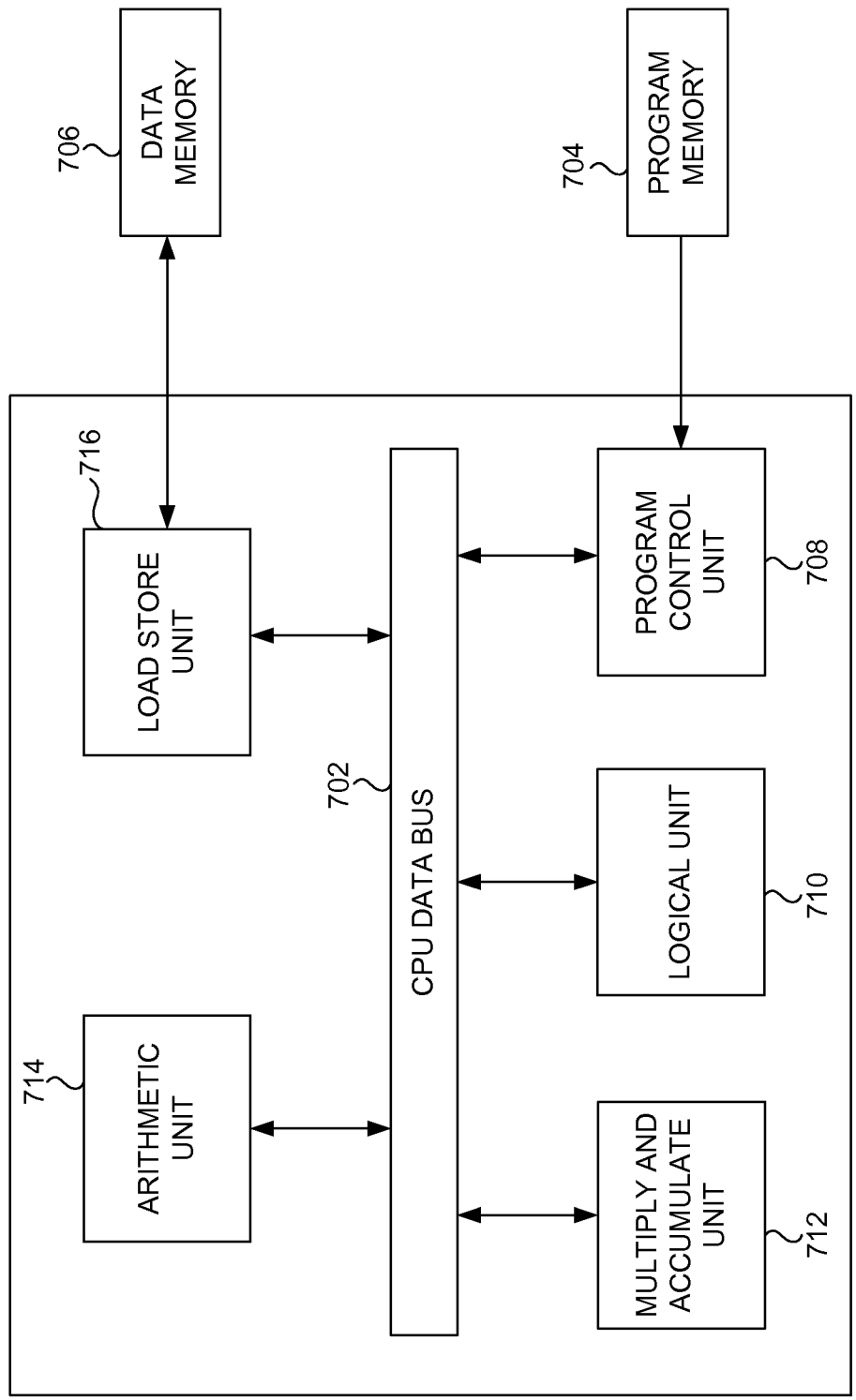
FIG. 7 illustrates an exploded view of architecture of a CPU implementing a digital filter and an adaptive filter according to an embodiment herein.

FIG. 7 illustrates an exploded view of architecture of a CPU implementing a digital filter and an adaptive filter according to an embodiment herein.

A routine implementation of a pseudo C code representing the digital filter implemented in the CPU is shown below.

```
/** Data Structures that represent the samples and coefficients in
hardware**/
    MAX_BLOCK_SIZE 6 // Represents the number of
multipliers/MACs in a DSP data path
    int16 samples[MAX_BLOCK_SIZE];
    /* Ideally Filter length can be longer than multiplier blocks, but for
illustration purposes here it is assumed that number of multipliers is same
as the filter length */
    int16 coeffiecnts[MAX_BLOCK_SIZE];
    /*Traditional FIR Filtering using a full width 16X16 Multiplier*/
    int FirFilter(INT16 *samples,INT16 *coeff)
    {
        INT64 acc=0;
        /* C model of multiply and accumalate */
        acc += (MULT16(samples[0],coeff[0]));
        acc += (MULT16(samples[1],coeff[1]));
        acc += (MULT16(samples[2],coeff[2]));
        acc += (MULT16(samples[3],coeff[3]));
        acc += (MULT16(samples[4],coeff[4]));
        acc += (MULT16(samples[5],coeff[5]));
        /* get 16 bit from the accumulator */
        filtOut = EXTRACT4ACC(acc,-1,2);
        return filtOut;
    }
```

The pseudo C code representing the digital filter includes MAC units. The number of MAC units is generally decided on a speed requirement and a target application that executes on a Digital Signal Processor (DSP). In SIMD (Single Instruction, Multiple Data), DSP architectures have a larger number of MACs to provide a higher throughput defined in terms of million operations per second (MOPS). The MAC units further include one or more bit-width multipliers with variable bit-widths for performing multiply operation. The DSP may provide special instructions to speed up parts of the pseudo C code.

The exploded view of a CPU with memory includes a data bus 702, a memory that includes a program memory 704 and a data memory 706. The processor further includes a program control unit 708, a logical unit 710, a multiply and accumulate unit (MAC) 712, an arithmetic unit 714, and a load store unit 716. The program memory 704 stores filter program comprising of a load or store instructions, a MAC instructions, and an Arithmetic instructions whereas, the data memory 706 stores incoming data samples and filter coefficients.

In case of a digital filter, the multiply and accumulate unit 712 or the arithmetic unit 714 or the load store unit 716, performs (i) computing of the first PDF of bit-widths of incoming data samples and the second PDF for bit-widths of filter coefficients of FIG. 2 for selecting a bit-width multiplier, and (ii) sorting of the incoming data samples 202 and the filter coefficients 204 of FIG. 5A to obtain the sorted incoming data samples and the sorted filter coefficients of the digital filter. Further, at least one of these units performs (iii) allocating the incoming data sample selected from the sorted incoming data samples, and the filter coefficient selected from the sorted filter coefficients of FIG. 5A to the least bit-width multiplier.

Similarly, in case of adaptive digital filter, at least one of these units performs (i) computing of the first PDF of bit-widths of incoming data samples of FIG. 4 to obtain the bit-width multiplier, and (ii) sorting of the incoming data samples 402 of FIG. 4 based on bit-widths of the incoming data samples 402 to obtain the sorted of incoming data samples. Also, at least one of these units performs (iii) allocating the filter coefficient selected from filter coefficients and the incoming data sample selected from the sorted incoming data samples of FIG. 6A to the least bit-width multiplier.

However, for both the digital filter and the adaptive digital filter, pre-scaling of the incoming data sample and the filter coefficient, a multiply and accumulate operation on the pre-scaled incoming data sample and the pre-scaled filter coefficient, and post-scaling are performed only in the multiply and accumulate unit 712.

Figure 8A:
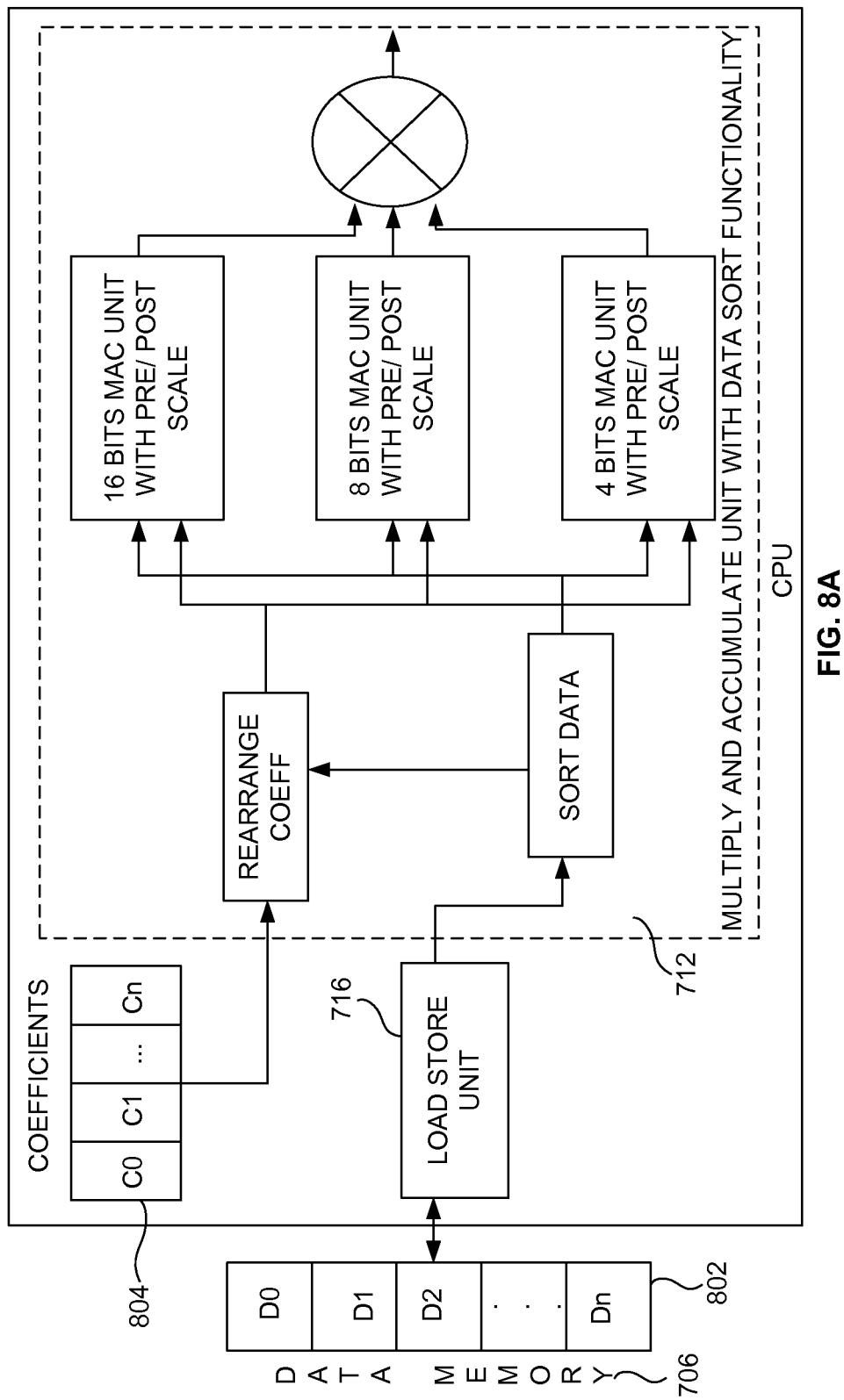
FIG. 8A illustrates sorting based on bit-widths of incoming data samples and filter coefficients by a MAC unit, stored in the data memory of FIG. 7 according to an embodiment herein.

FIG. 8A illustrates sorting based on bit-widths of incoming data samples 802 and filter coefficients 804 by the MAC unit 712, stored in the data memory 706 of FIG. 7 according to an embodiment herein. The sorting of incoming data samples 802 and filter coefficients 804 causes an additional delay in the cycle. This delay may be compensated by performing software pipelining. The software pipelining is achieved by executing an instruction for sorting as a part of the MAC instructions stored program memory 704 of FIG. 7.

A pseudo code using the MAC instructions is shown below:

```
LD [coeff++],CoeffReg /* Normal Load instruction */
LoopBack:
LD [inp++],DataReg /* Normal Load instruction */
NOP 5 /*These NOPs can be hidden using software pipelining*/
MACVP CoeffReg,DataReg /* Special Instruction for MAC*/
NOP 5 /*These NOPs can be hidden using software pipelining*/
READ ACC,R0
SUBI R2,#1 //Check All Data samples are processed or not
CMP R2,#0
[NEQ]BRANCH LoopBack
```

The MAC unit 712 executes MAC instructions for sorting the incoming data samples 802, the filter coefficients 804, and multiply and accumulate operation on a sorted data simultaneously.

Figure 8B:
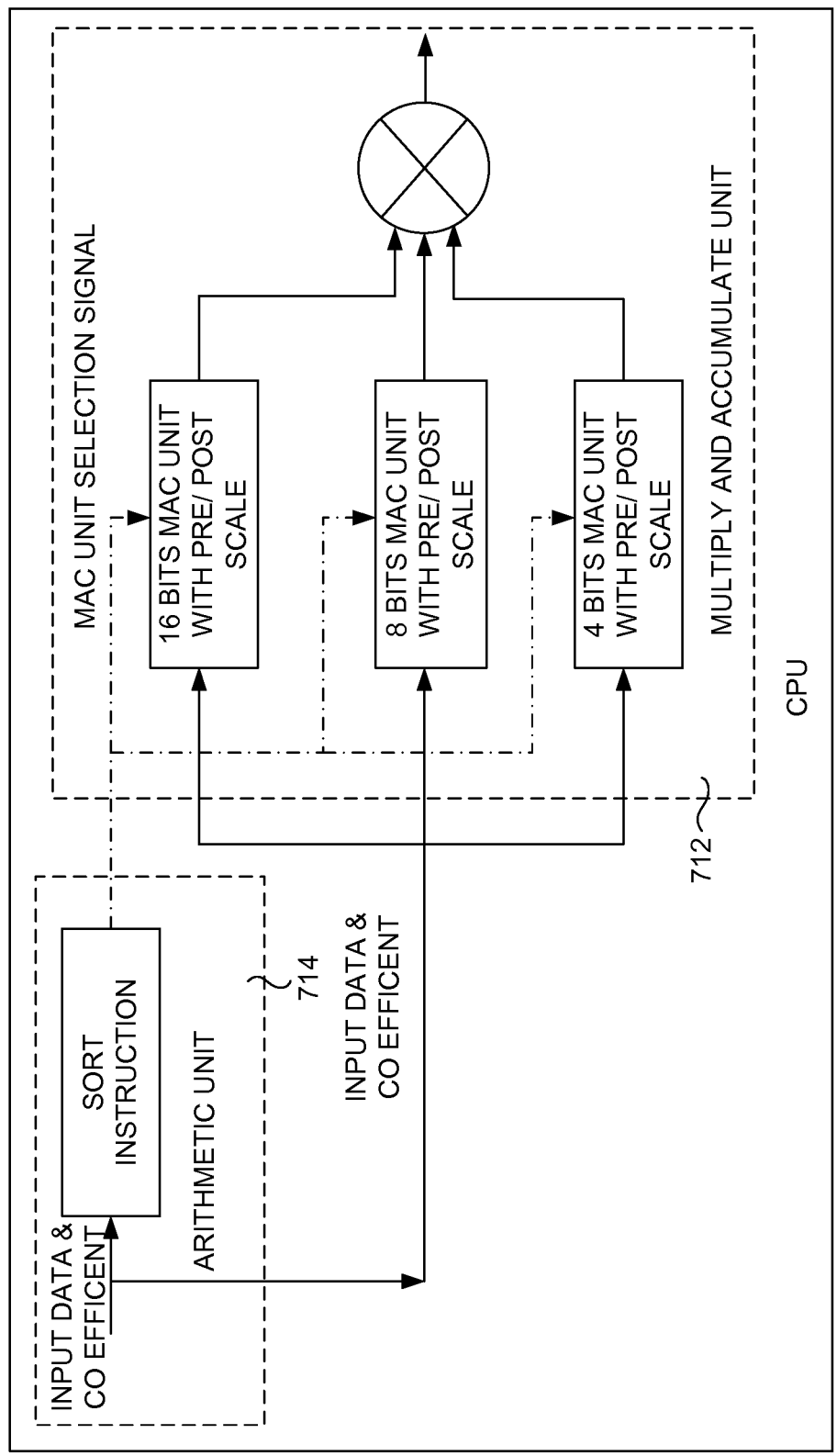
FIG. 8B illustrates sorting of the incoming data samples and the filter coefficients of FIG. 8A by an arithmetic unit stored in the data memory of FIG. 7 according to an embodiment herein.

FIG. 8B illustrates sorting of the incoming data samples 802 and the filter coefficients 804 of FIG. 8A by the arithmetic unit 714, stored in the data memory 706 of FIG. 7 according to an embodiment herein. The delay in sorting is compensated by executing an instruction for sorting as a part of the arithmetic instructions stored in the program memory 704.

A pseudo code using the arithmetic instructions is shown below:

```
LD [coeff++],CoeffReg
LoopBack:
LD [inp++],DataReg /* Normal Load instruction */
NOP 5 /*These NOPs can be hidden using software pipelining*/
SORT DataReg /* Special Instruction for Sort*/
SORT CoeffReg
NOP 5 /*These NOPs can be hidden using software pipelining*/
```

```
MAC DataReg, CoeffReg
READ ACC,R0
SUBI R2,#1 //Check All Data samples are processed or not
CMP R2,#0
[NEQ]BRANCH LoopBack
```

The arithmetic unit 714 executes the arithmetic instructions to perform an arithmetic calculation, and sorting the incoming data samples 802 and the filter coefficients 804 simultaneously.

Figure 8C:
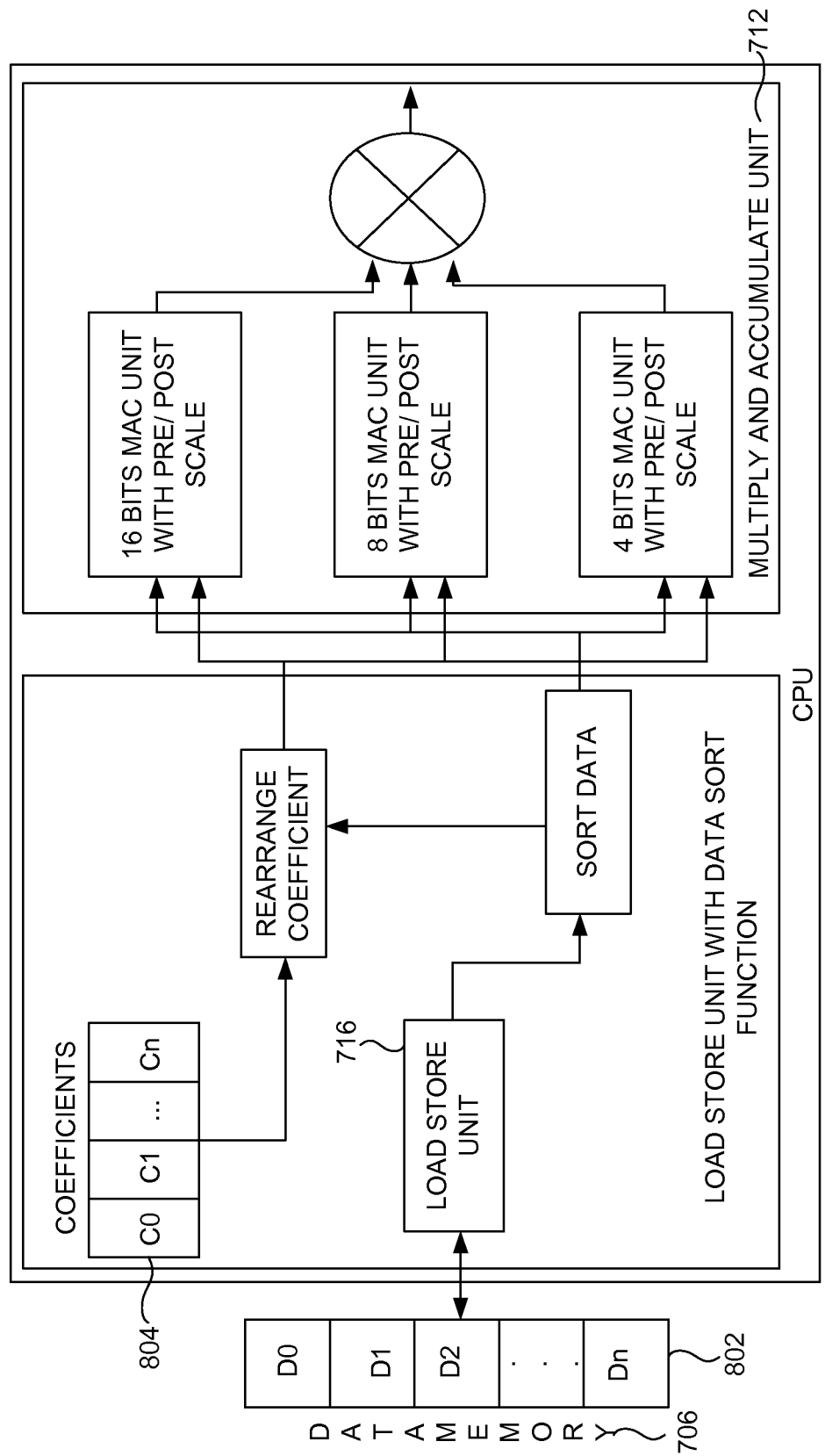
FIG. 8C illustrates sorting of the incoming data samples and the filter coefficients based on bit-widths of the incoming data samples and bit-widths of the filter coefficients by a load store unit stored in the data memory of FIG. 7 according to an embodiment herein.

FIG. 8C illustrates sorting of the incoming data samples 802 and the filter coefficients 804 based on bit-widths of the incoming data samples and bit-widths of the filter coefficients by the load store unit 716, stored in the data memory 706 of FIG. 7 according to an embodiment herein. The delay in sorting is compensated by executing an instruction for sorting as a part of the load or store instructions stored in the data memory 706.

A pseudo code using the load or store instructions is shown below:

```
LDVP [coeff++],CoeffReg /*Special Load instruction */
LoopBack:
LDVP [inp++],DataReg /* Special Load instruction */
NOP 5 /*These NOPs can be hidden using software pipelining*/
MAC CoeffReg.DataReg /*Normal MAC instruction */
NOP 5
READ ACC,R0
SUBI R3,#1
CMP R3,#0
[NEQ]BRANCH LoopBack
```

The load store unit 716 executes the load or store instructions for performing loading, storing and sorting of the incoming data samples 802 and the filter coefficients 804 simultaneously. The above implementation of the sorting results in both reduced area and power in the digital filter. In one embodiment, the above implementation is applied in the adaptive digital filter by sorting the incoming data samples 802 only.

Figure 9:
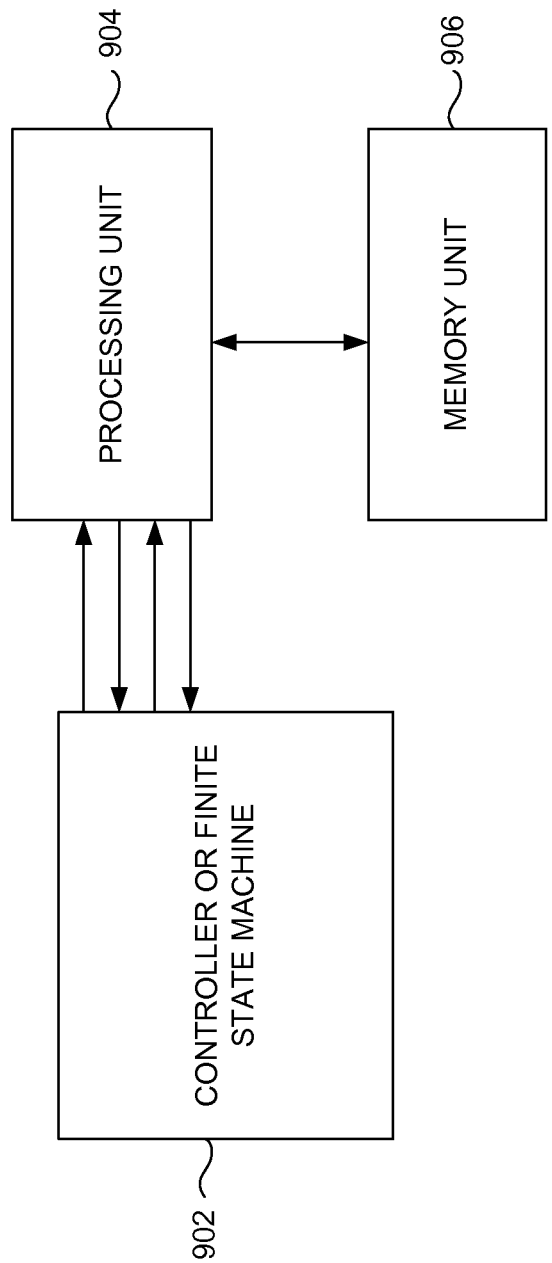
FIG. 9 illustrates a block diagram of a Finite State Machine (FSM) with a Processing unit for implementing a digital filter or an adaptive digital filter according to an embodiment herein.

FIG. 9 illustrates a block diagram of a Finite State Machine (FSM) 902 with a Processing unit 904 for implementing a digital filter or an adaptive digital filter according to an embodiment herein. The block diagram includes the FSM or controller 902 communicating to a processing unit 904 that sequences the processing unit 904 while the filter coefficients and incoming samples are stored in a memory unit 906. Similar to the CPU of FIG. 7, the FSM or controller includes the special instruction, the MAC instruction and the load store instruction is executed by the processing unit 904 to perform (i) computing of PDF, (ii) selecting a bit-width multiplier from the bit-width multiplier based on the PDF, (iii) sorting of incoming data samples and filter coefficients based on bit-width, (iv) allocating an incoming data sample and a filter coefficient to the bit-width multiplier, (v) a pre-scaling, (vi) a multiply and accumulate operation and (vii) post-scaling operation on the result of multiply and accumulate operation.

Figure 10:
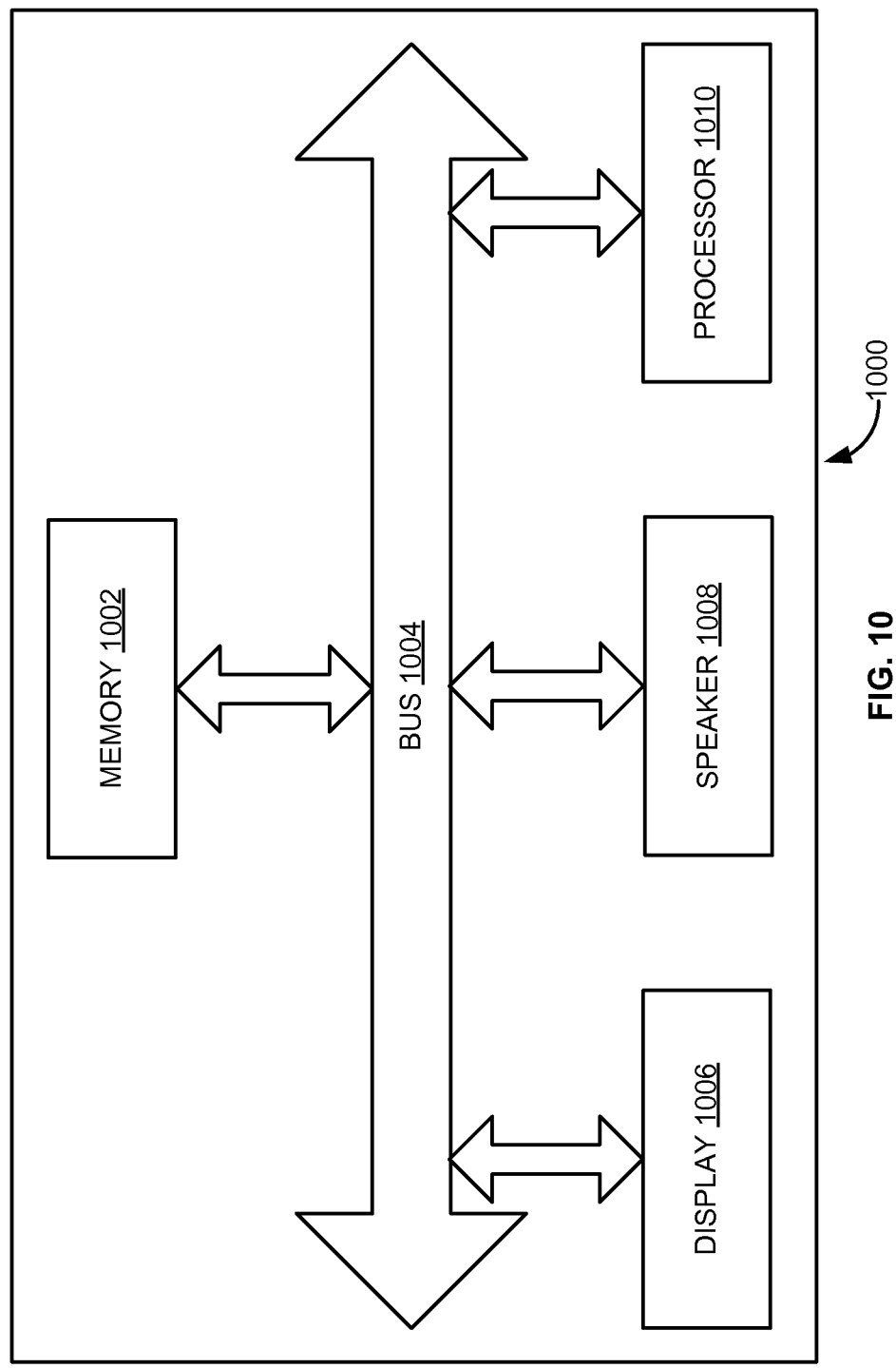
FIG. 10 illustrates an exploded view of a receiver having an a memory having a set of computer instructions, a bus, a display, a speaker, and a processor capable of processing a set of instructions to perform any one or more of the methodologies herein, according to an embodiment herein.

FIG. 10 illustrates an exploded view of a receiver 1000 having an a memory 1002 having a set of computer instructions, a bus 1004, a display 1006, a speaker 1008, and a processor 1010 capable of processing a set of instructions to perform any one or more of the methodologies herein, according to an embodiment herein. The processor 1010 may also enable digital content to be consumed in the form of video for output via one or more display 1006 or audio for output via speaker 1008 and/or earphones. The processor 1010 may also carry out the methods described herein and in accordance with the embodiments herein. Digital content may also be stored in the memory 1002 for future processing or consumption. The memory 1002 may also store program specific information and/or service information (PSI/SI), including information about digital content (e.g., the detected information bits) available in the future or stored from the past. A user of the receiver 1000 may view this stored information on display 1006 and select an item of for viewing, listening, or other uses via input, which may take the form of keypad, scroll, or other input device(s) or combinations thereof. When digital content is selected, the processor 1010 may pass information. The content and PSI/SI may be passed among functions within the receiver 1000 using bus 1004. The implementation of the digital filter as described above is implemented in the receiver 1000.

The pseudo C code of sorting:

```
MAX_BLOCK_SIZE 6 // Represents the number of multipliers/MACs in
a DSP data path
int16 samples[MAX_BLOCK_SIZE];
int16 coeffiecnts[MAX_BLOCK_SIZE];
int StatisticalFirFilter(INT16 *samples,INT16 *coeff)
{
INT64 acc=0;
/*Sort the incoming (data, coefficient) pair based on the precision */
sort(samples, coeff);
/* C model of multiply and accumalate */
acc += (MULT16(samples[0],coeff[0]);
acc += (MULT16(samples[1],coeff[1]);
acc += (MULT8(samples[2],coeff[2]);
acc += (MULT8(samples[3],coeff[3]);
acc += (MULT4(samples[4],coeff[4]);
acc += (MULT4(samples[5],coeff[5]);
/* get 16 bit from the accumulator */
filtOut = EXTRACT4ACC(acc,-1,2);
return filtOut;
}
    void sort(INT16 *samples,INT16 *coeff)
    {
    int index,i;no_16cross16_muls=0,
    no_8cross8_muls=2,no_4cross4_muls=4;
    for( i=0;i<MAX_BLOCK_LENGTH)
    {
    /* Figure out the highest precision required for a given pair of data
and coefficient */
        max_precision= (get_EXP(samples)>get_EXP(coeff))?
    get_EXP(samples):get_EXP(coeff) ;
        switch( max_precision )
        {
        mul_16cross16 :
    /* Check if we have exhausted the 16 bit multipliers */
            scale_factor= (no_16cross16_muls++ > 2 ) ?
            (no_8cross8_muls > 3 ?12:8):0;
            /* scale down to fit in the given width */
            sample[i] >>= scale_factor;
            coeff[i] >>= scale_factor;
    index= (no_16cross16_muls++ > 2 ?
            no_8cross8_muls > 3
    ?no_8cross8_muls:no_4cross4_muls)
    :++no_16cross16_muls;
            break;
            mul_8cross8 :
    /* Check if we have exhausted 8 bit, and if so upgrade to a higher bit
width */
            index= no_8cross8_muls > 3 ?
            ++no_16cross16_muls:++no_8cross8_muls;
            break;
        mul_4cross4 :
    /* Check if we have exhausted 8 bit, and if so upgrade to a higher bit
width */
            index= no_4cross4_muls > 5 ? (no_8cross8_muls>3
            ? ++no_16cross16_muls:++no_8cross8_muls)
                :++no_4cross4_muls;
            break;
    }
```

```
/* re-arrange the input at the appropriate index */
    samples[index]=samples[i];
}
```

The foregoing description of the specific embodiments will so fully reveal the general nature of the embodiments herein that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments herein have been described in terms of preferred embodiments, those skilled in the art will recognize that the embodiments herein can be practiced with modification within the spirit and scope of the appended claims.

What is claimed is:

1. A method for implementing a digital filter, said method comprising:
   (a) determining a bit-width of an incoming data sample of an incoming signal by measuring a distance between a leading zero or one of said incoming data sample and a trailing zero of said incoming data sample, wherein said incoming data sample is obtained by sampling said incoming signal at a pre-defined time interval;
   (b) obtaining a plurality of bit-width multipliers with variable bit-widths based on a first probability distribution function (PDF) for a plurality of bit-widths of a plurality of incoming data samples; and
   (c) allocating said incoming data sample and a filter coefficient, based on said bit-width of said incoming data sample and a bit-width of said filter coefficient, to one bit-width multiplier of said plurality of bit-width multipliers; and
   (d) performing a multiply operation of a Multiply and Accumulate (MAC) operation on said one bit-width multiplier to generate an output of said digital filter.

2. The method of claim 1, further comprising:
   (e) computing a second probability distribution function (PDF) for a plurality of bit-widths of filter coefficients.

3. The method of claim 2 further comprising obtaining said plurality of bit-width multipliers with variable bit-widths based on a combination of (i) said first PDF for said plurality of bit-widths of incoming data samples and (ii) said second PDF for said plurality of bit-widths of filter coefficients.

4. The method of claim 2 further comprising sorting a plurality of incoming data samples of said incoming signal and a plurality of filter coefficients of said digital filter to obtain sorted incoming data samples and sorted filter coefficients, wherein said incoming data sample and said filter coefficient are allocated to said one bit-width multiplier based on said sorted incoming data samples and said sorted filter coefficients.

5. The method of claim 4, wherein said plurality of incoming data samples and said plurality of filter coefficients are sorted simultaneously by a load store unit while performing:
   (i) loading of said plurality of incoming data samples and said plurality of filter coefficients; and
   (ii) storing of said plurality of incoming data samples and said plurality of filter coefficients.

6. The method of claim 4, wherein said plurality of incoming data samples and said plurality of filter coefficients are sorted by a Multiply and Accumulate (MAC) unit simultaneously while performing a multiply and accumulate operation.

7. The method of claim 4, wherein said plurality of incoming data samples and said plurality of filter coefficients are sorted by an arithmetic unit simultaneously while performing an arithmetic calculation.

8. The method of claim 1 further comprising dynamically computing said first PDF for said plurality of bit-widths of said plurality of incoming data samples by measuring distances between leading zeros or ones and trailing zeros for each of said incoming data samples.

9. The method of claim 1, wherein allocating said incoming data sample and said filter coefficient to said one bit-width multiplier comprises:
   (f) determining a maximum out of said bit-width of said incoming data sample and said bit-width of said filter coefficient;
   (g) determining a subset of bit-width multipliers from said plurality of bit-width multipliers having a bit-width greater than said maximum out of said bit-width of said incoming data sample and said bit-width of said filter coefficient; and
   (h) determining a least bit-width multiplier out of said subset of bit-width multipliers.

10. The method of claim 1 further comprising sorting a plurality of incoming data samples of said incoming signal in an order of low bit-width precision to high bit-width precision to obtain sorted incoming data samples, wherein said incoming data sample is allocated to said bit-width multiplier based on said sorted incoming data samples.

11. A system for implementing a digital filter, said system comprising:
    memory that stores a plurality of incoming data samples; and
    a processor that executes a set of instructions, wherein said processor comprises at least one of: (i) a load store unit, (ii) a Multiply and accumulate (MAC) unit, and (iii) an arithmetic unit, said set of instructions including instructions for:
    (a) determining a bit-width of an incoming data sample of an incoming signal by measuring a distance between a leading zero or one of said incoming data sample and a trailing zero of said incoming data sample, wherein said incoming data sample is obtained by sampling said incoming signal at a pre-defined time interval;
    (b) obtaining a plurality of bit-width multipliers with variable bit-widths based on a first probability distribution function (PDF) for a plurality of bit-widths of incoming data samples; and
    (c) allocating said incoming data sample and a filter coefficient, based on a bit-width of said incoming data sample and a bit-width of said filter coefficient, to one bit-width multiplier of said plurality of bit-width multipliers; and
    (d) performing a multiply operation of a Multiply and Accumulate (MAC) operation on said one bit-width multiplier to generate an output of said digital filter.

12. The system of claim 11, wherein said set of instructions further comprising instructions for:
    (e) computing a second probability distribution function (PDF) for a plurality of bit-widths of filter coefficients.

13. The system of claim 12, wherein said plurality of bit-width multipliers with variable bit-widths is obtained based on a combination of (i) said first PDF for said plurality of bit-widths of incoming data samples and (ii) said second PDF for said plurality of bit-widths of filter coefficients.

14. The system of claim 11, wherein instructions for allocating said incoming data sample and said filter coefficient to said bit-width multiplier include instructions for:
- (f) determining a maximum out of said bit-width of said incoming data sample and said bit-width of a filter coefficient;
- (g) determining a subset of bit-width multipliers from said plurality of bit-width multipliers having a bit-width greater than said maximum out of said bit-width of said incoming data sample and said bit-width of a filter coefficient; and
- (h) determining a least bit-width multiplier out of said subset of bit-width multipliers.

15. The system of claim 14, wherein clocks or power for said plurality of bit-width multipliers, other than said least bit-width multiplier out of said subset of bit-width multipliers, are gated off while allocating said incoming data sample and said filter coefficient to said least bit-width multiplier.

\* \* \* \* \*